United States Patent [19]

Tamura et al.

[11] 4,398,266

[45] Aug. 9, 1983

[54] INTEGRATED CIRCUIT

[75] Inventors: Teiji Tamura; Hiroshi Mayumi, both of Tokyo, Japan

[73] Assignee: Nippon Electric Co., Ltd., Tokyo, Japan

[21] Appl. No.: 173,248

[22] Filed: Jul. 29, 1980

[30] Foreign Application Priority Data

Jul. 30, 1979 [JP] Japan .................................. 54-97833

[51] Int. Cl.³ .............................................. G11C 11/40
[52] U.S. Cl. ..................................... 365/103; 365/189
[58] Field of Search ............... 365/103, 104, 100, 189, 365/230, 205

[56] References Cited

U.S. PATENT DOCUMENTS

| | | | |
|---|---|---|---|
| 3,402,398 | 9/1968 | Koerner | 365/230 |
| 3,560,940 | 2/1971 | Gaensslen | 365/230 |
| 3,771,147 | 11/1973 | Ball et al. | 365/205 |
| 3,774,171 | 11/1973 | Regitz | 365/230 |
| 3,909,805 | 9/1975 | Touron et al. | 365/230 |
| 4,044,341 | 8/1977 | Stewart et al. | 365/203 |

*Primary Examiner*—Terrell W. Fears
*Attorney, Agent, or Firm*—Sughrue, Mion, Zinn, Macpeak & Seas

[57] ABSTRACT

An integrated circuit provided with at least one field-programmable element matrix which is reduced in size and improved in an electrical characteristics is disclosed. The circuit is characterized in that the matrix is physically divided into at least two separate parts, at least a part of a logic circuit for applying a logic input to the matrix or for receiving a logic output from the matrix in a read mode is disposed outside of the separate parts of the matrix, and at least a part of a selection circuit for writing or programming the matrix is disposed between the two divided parts of the matrix.

11 Claims, 5 Drawing Figures

INTEGRATED CIRCUIT

BACKGROUND OF THE INVENTION

The present invention relates to an integrated circuit, and more particularly to a field-programmable logic array (hereinafter abbreviated as FPLA) that can be realized in the form of a monolithic integrated circuit.

As is well known, an FPLA has been described as an LSI which can realize a random arbitrary logic circuit through the process whereby a user electrically writes (that is, "programs") the circuit freely at hand (that is, in "the field"). Similarly to a programmable logic array which is programmed by means of a mask during production (hereinafter abbreviated as "mask PLA"), an FPLA comprises a plurality of programmable element matrixes for achieving an AND-function and/or a plurality of OR-functions, and the inputs and outputs of these matrixes are connected to each other or to other input logic sections or output logic sections either directly or via buffer circuits. Moreover, in an FPLA there are provided selection circuits for programming the rows and the columns, respectively, of the programmable element matrixes so that any bit in the programmable element matrixes can be programmed in the field, unlike the simple mask PLA. Accordingly, in general, along the periphery of the programmable element matrixes must be disposed respective circuits in a logic system and respective peripheral circuits for programming in correspondence to the rows and the columns, respectively, of the element matrixes. This brings about serious problems especially in the case where an FPLA of large capacity is to be designed. As one problem, generally in a large-capacity and high-density FPLA, whereas the rows and columns of the programmable element matrix are arrayed at a minimum pitch, in the peripheral circuit, especially in a circuit in the logic system it is difficult to design a unit circuit corresponding to one row or one column so as to come within the same minimum pitch, and if these unit circuits are arrayed along one side of a chip, then the side of the chip must be greatly expanded as compared to the corresponding edge of the programmable element matrix, and hence the design arrangement becomes inefficient with respect to a chip area.

As a second problem, in an FPLA, in most cases the input and output terminals (of the logic system) are generally connected to the programmable element matrixes directly without being decoded at all or almost without being decoded unlike a random access memory. Thus, in a large-capacity FPLA a large number of input and output terminals are necessitated, and these terminals are compelled to be disposed along the entire periphery of the chip. However, if a peripheral circuit in the logic system is disposed close to one edge of the element matrix then in order to connect to the input or output of the peripheral circuit, most of the large number of input or output terminals must be connected through long wirings along the periphery of the chip, and this is also inefficient with respect to a chip area in the design of arrangement and with respect to performance.

As a third problem, in an FPLA also, like the conventional Programmable Read Only Memory (PROM), upon programming a large electric current must be passed through selected row and column of the programmable element matrix via programming circuits for the rows and the columns in order to feed energy necessary for programming. Accordingly, if these programming circuits for the rows and the columns are disposed close to one edge of the programmable element matrix, then for the purpose of writing in the programmable element of the matrix which is farthest from the programming circuits, a large electric current must be passed along the length of two edges of the matrix. Thus, the potential drops in the row and column wirings occurring at that time become large, and hence in some cases, the potential drops undesirably affect the writing or programming characteristics. These problems are also true, besides the FPLA, in the case of the so-called non-volatile memories in which a storage effect of information is achieved by selective injection of electric charge into a floating gate or certain insulating film such as a silicon nitride film and an alumina film, etc. In these non-volatile memories, the writing necessitates means for applying a voltage to a programmable element, separately from that used upon reading, and hence the peripheral circuits and the associated input and output wirings occupy a large portion of the area of the chip.

SUMMARY OF THE INVENTION

Therefore, it is one object of the present invention to provide an integrated circuit including at least a programmable element matrix in which peripheral circuits, especially those in a logic system are, as a whole, efficiently disposed with respect to a programmable element matrix that is arranged at a minimum pitch.

Another object of the present invention is to provide a programmable integrated circuit in which especially the lengths of the wirings extending from input and output terminals in a logic system to peripheral circuits in the logic system as well as the chip area occupied by the wirings are minimized.

Still another object of the present invention is to provide a programmable integrated circuit in which the lengths of the row and column paths of the programmable element matrix to be used upon programming are shortened to minimize the potential drop occurring between the current source and the programming point.

According to the present invention, attention has been paid to the fact that all of the aforementioned objects can be achieved, when a memory or programmable element matrix is divided into a plurality of parts, for example, two parts. A programming circuit (for one edge of the matrix) is disposed between these two divided parts, and a logic system circuit for one edge of the matrix is disposed on the both sides of the element matrix as divided into two parts.

According to one feature of the present invention, there is provided a monolithic field-programmable logic array including at least one field-programmable element matrix, in which the matrix is disposed as physically divided into and at least two parts, at least a part of a logic circuit for applying a logic input to the matrix or a logic circuit for receiving a logic output from the matrix is divided into two parts and disposed outside of the matrix. At least a part of a selection circuit for programming the matrix is disposed between the two divided parts of the matrix.

According to one feature of the present, there is also provided a semiconductor integrated circuit comprising a pair of spaced-apart memory matrixes, each of the memory matrixes including a plurality of memory elements arranged in rows and columns, and a write logic circuit arranged between said pair of spaced-apart memory matrixes, in which the write logic circuit is operable in a write mode and selectively forms a write current path with at least one of the rows of the matrixes.

BRIEF DESCRIPTION OF THE DRAWINGS

The above-mentioned and other objects and features of the present invention will become more apparent by reference to the following description of its preferred embodiment taken in conjunction with the accompanying drawings, wherein.

DESCRIPTION OF THE PRIOR ART

Figure 1:
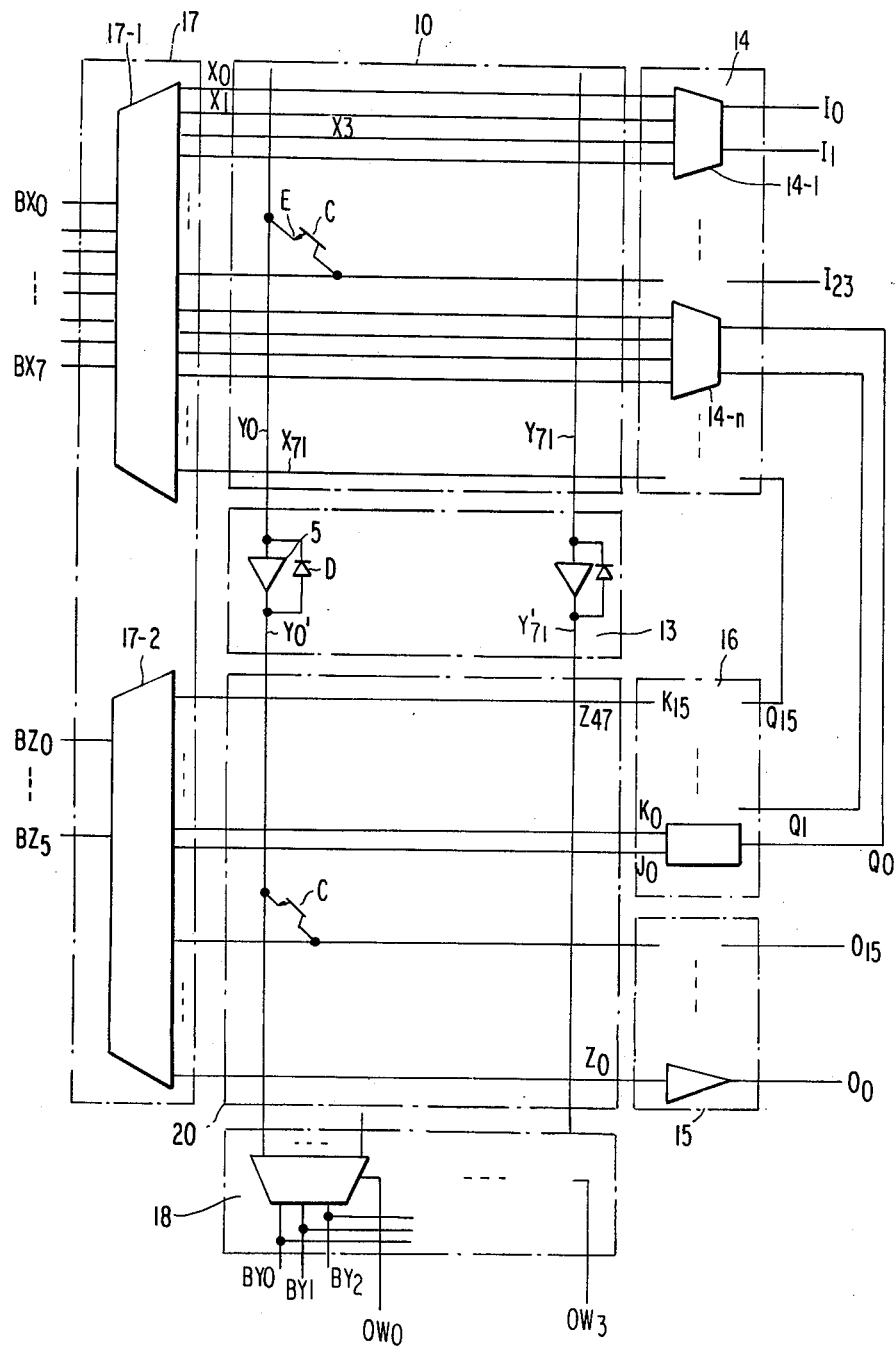
FIG. 1 is a block diagram showing a general FPLA.

Now description will be made on the problems occurring in a general FPLA, with reference to FIG. 1. The illustrated FPLA comprises an AND matrix (or AND array) 10 having program elements C disposed at the respective crosspoints between input lines $X_0 \sim X_{71}$ and logical product term lines $Y_0 \sim Y_{71}$, and an OR matrix (or OR array) 20 having program elements C disposed at the respective crosspoints between input lines $Y'_0 \sim Y'_{71}$ and logical sum lines $Z_0 \sim Z_{47}$, and also there is provided an AND selection circuit 14 for selectively energizing input lines of the AND matrix 10. In addition, the outputs derived by the product term lines from the AND matrix 10 are respectively led into the OR matrix 20 via buffers 5. The outputs from the OR matrix 20 are derived as outputs $O_0 \sim O_{15}$ via buffers 15 such as inverters. Programming or writing in such an FPLA can be achieved by breaking down the base-emitter junction of the program element C through the steps of selecting the input line for writing by means of an X-decoder 17-1, selecting the logical product term line for writing by means of a Y-decoder 18, applying a voltage from the Y-decoder 18 to the emitter E of the program element C via a diode D, and absorbing the current by the X-decoder 17-1 through one of the selected input lines $X_0$ to $X_{71}$. Likewise, in the OR matrix 20 also, programming (writing) can be achieved by making use of a Z-decoder 17-2 and the Y-decoder 18. In the conventional FPLA, as illustrated in FIG. 1, on the same side (on the left side in the illustrated example) of the AND matrix 10 and OR matrix 20 are respectively disposed decoders 17-1 and 17-2 for programming so that the outputs of the decoders may align with the respective matrixes in the direction of rows. In general, the layout distance between the adjacent outputs of such a decoder is large as compared to the distance between rows (between adjacent parallel input lines) in the AND matrix or the OR matrix, and also the decoders 17-1 and 17-2 for programming would occupy a large chip area as compared to the respective matrixes. Therefore, it was difficult to achieve such arrangement on a small chip area. In addition, if the decoders 17-1 and 17-2 are disposed only one one side of the matrixes 10 and 20 in the above-described manner, then in the case of carrying out programming or writing in the program element C at the farthest end of the input line of, for example, one disposed at the intersection of the input line $X_0$ and the product term line $Y_{71}$, owing to the fact that the resistance of the input line would have a large effect largely and thus a voltage drop and heat generation would arise in the input line, an increase in programming or writing time and a voltage drop in the input line result, and hence stable programming or writing becomes difficult. This problem becomes more significant as the number of the program elements connected to one input line is increased, and hence the problem has accompanied the increase of a memory capacity.

In the illustrated FPLA, to the inputs of the 2-bit decoders 14-1, . . . 14-n in the decoder 14 are connected input terminals $I_0 \sim I_{23}$ and feedback outputs $Q_0 \sim Q_{15}$ from J/K flip-flops 16 as described later. The outputs of the OR matrix 20 are partly connected to output terminals $O_0 \sim O_{15}$ via output buffers 15, but the remaining outputs are used as J/K inputs $J_0$, $K_0 \sim J_{15}$, $K_{15}$ of the contained J/K flip-flops 16.

Figure 2:
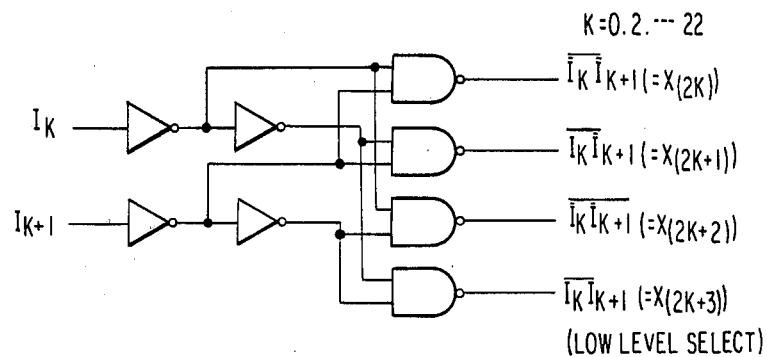
FIG. 2 is a block diagram showing a 2-bit decoder as used in the FPLA in FIG. 1.

Now, with regard to a programming peripheral circuit, in order to make random access to and write in any cell in these matrixes, for example, an X-decoder 17-1 and a Y-decoder 18 are provided. While there are provided input terminals $BX_0 \sim BX_7$ and $BY_0 \sim BY_2$ for these decoders and programming current feed terminals $OW_0 \sim OW_8$ and these terminals are provided as independent terminals, it is possible to design the circuit in such a manner that these terminals may be made physically common with the input and output terminals in the logic system. The structure of each of the 2-bit decoders 14-1, . . . , 14-n may be as illustrated in FIG. 2. In this structure, 4 outputs can be decoded from inputs $I_k$ and $I_{k+1}$ for every adjacent 2 bits.

Figure 3:
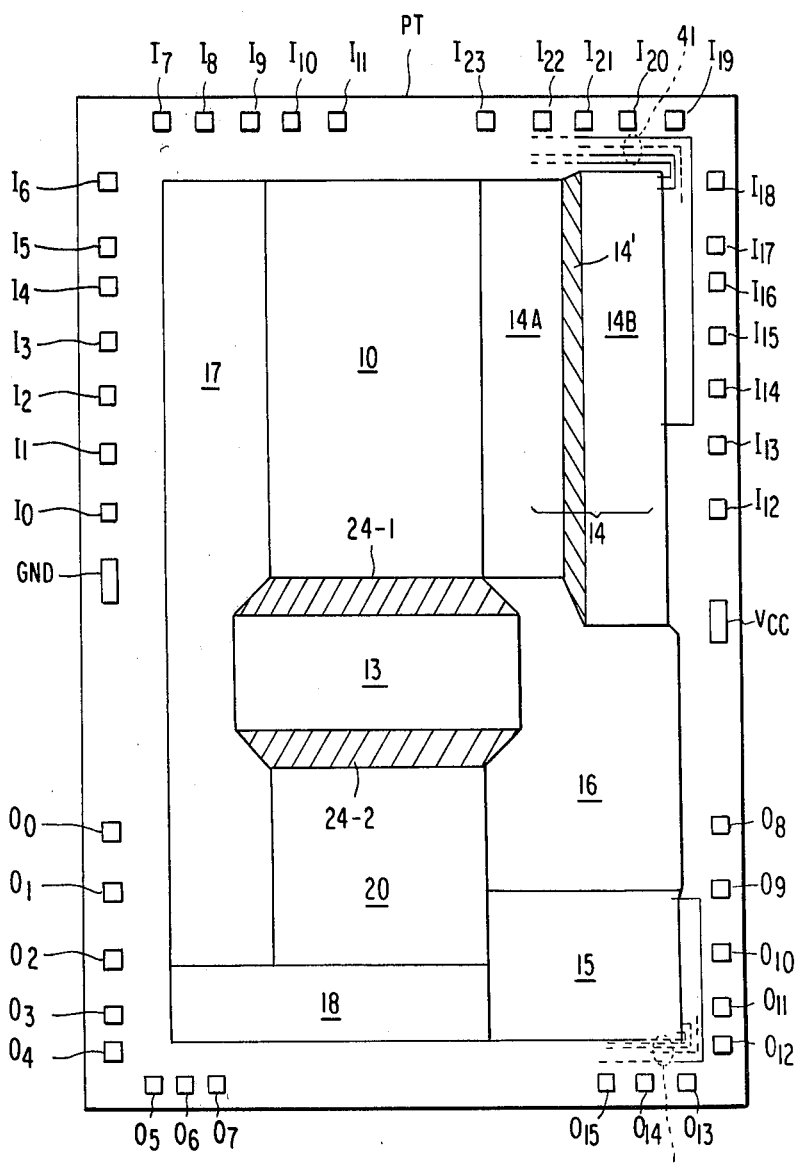
FIG. 3 is a layout diagram showing an FPLA IC in the prior art.

A prior art chip layout of the FPLA shown in FIG. 1 will be described with reference to FIG. 3. In this conventional layout, a decoder 17 for programming is disposed on the left side of an AND matrix 10 and an OR matrix 20, and a logic input circuit 14 and a logic output buffer 15 are disposed on the right side of these matrixes. In this example, the pitch of the cells between rows is 30 μm, whereas the length of one unit between the rows of the logic input circuit 14 is 60 μm. In order to establish matching between the logic input circuit 14 and the matrix 10, the input circuit 14 is formed in a superposed 2-stage construction. More particularly, provision is made such that the input circuit 14 included in the part 14A takes charge of even number rows in the matrix 10, while the input circuit 10 included in the part 14B takes charge of odd number rows in the matrix. Since input signal lines leading to the input circuit in the part 14A pass through the gaps between the unit input circuits included in the part 14B, the practical pitch in the part 14B will become broader than 60 82 m. Assuming that the line width is 5 μm and the gap distance is 5 μm, the practical pitch becomes 70 μm. Consequently, mismatching of pitches will occur between the parts 14A and 14B, and hence a region 14' for connecting these mismatched parts is necessary. This region will become unnecessary if provision is made such that no mismatching of pitches may arise. This kind of mismatching of pitches is also present in the column direction in which regions 24-1 and 24-2 are provided for this between the matrixes 10 and 20 and buffer section 13.

With regard to wirings between external terminals and internal elements, the wirings of the input and output terminals $I_0$, $O_0$ extend along the edges the pellet PT nearly over one-half of the periphery up to the internal elements of the circuits 14 and 15 to which the terminals are to be connected. This results in a large parasitic capacitance and a large wiring resistance, and thus it is undesirable in view of the performance of the circuit. For instance, the wiring for the output terminal $O_0$ extends for about 8 mm and the parasitic capacitance associated with this wiring is about 3 pF. In addition, since the input and output terminals for the internal elements are concentrated along one edge of the pellet, a large number of wirings concentrate at certain locations as schematically shown at 41 and 42 in FIG. 3 (for instance, more than 20 wirings concentrate at the location 41), so that layout of the other wirings becomes difficult and the pellet size is made large. Such a problem occurs due to the fact that the internal elements to be connected to the external terminals are not disposed in the proximity of those external terminals.

Since a large current is passed through the above described programming route upon programming, it is necessary to minimize the wiring resistance. If the wiring resistance is high, writing energy would not be fully transmitted to the program elements, and hence stable writing cannot be achieved. In the illustrated layout, since the X-decoder 17 is disposed on one side (on the left side) of the matrix, the wiring resistance between the right end cells and the X-decoder is high, and this writing becomes unstable.

DETAILED DESCRIPTION OF THE PREFERRED EMBODIMENT

Figure 4:
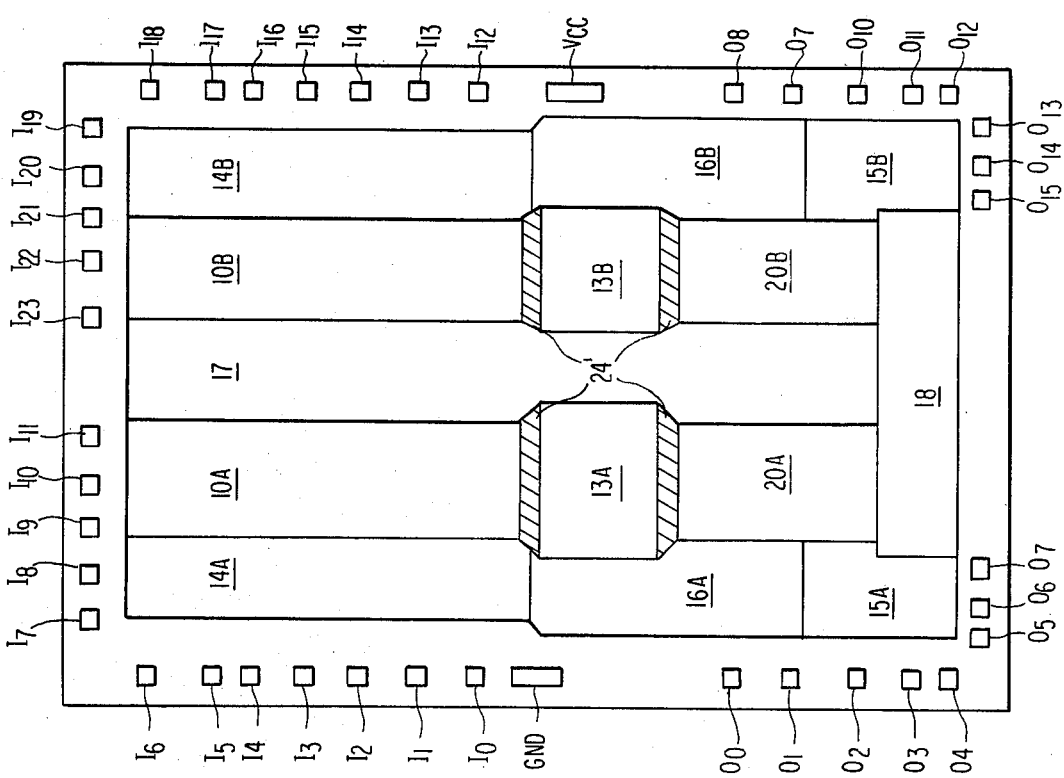
FIG. 4 is a layout diagram showing an FPLA IC according to the present invention.

Now description will be made with regard to on the case where the structure of the FPLA shown in FIG. 1 is realized as a semiconductor integrated circuit according to the present invention, with reference to FIG. 4.

In the illustrated embodiment, the AND matrix 10, buffer 13 and OR matrix 20 are respectively longitudinally divided into two halves along their center lines, and the decoder 17 (17-1, 17-2) within a programming circuit is disposed between these two halves. More particularly, by disposing the decoder 17 at the center, one half 10A of the AND matrix 10 and the other half 10B are disposed respectively on opposite sides of the X-decoder 17, and the 2-bit decoders 14A, 14B, output buffers 15A, 15B and J/K flip-flop 16A, 16B within the logic system circuit are disposed outside of the matrix 10A, 10B as divided into two parts. In the illustrated example, the programming input terminals $BX_0 \sim BX_7$, $BY_0 \sim BY_7$ and $OW_0 \sim OW_8$ in FIG. 2 are, in principle, made common to the logic system input and output terminals $I_0 \sim I_{23}$ and $O_0 \sim O_5$, since both of them are not used at the same time. Similarly to the example shown in FIG. 1, the programming operation can be effected by making use of the X-decoder 17 and the Y-decoder 18 to feed a write current from the Y-decoder 18 side to the X-decoder 17 side. The Y-decoder 18 responds to 3-bit inputs $BY_0 \sim BY_2$ for selecting one output for every decoding block, and further it selects a write voltage by selectively feeding one of the signals on the terminals $OW_0 \sim OW_8$ to one block. In this embodiment, the total area of four minimized regions 24' required for mismatching is made smaller than the case of FIG. 3.

By employing the above-mentioned arrangement, the following advantages are obtained. First, since the complex logic system peripheral circuits such as 2-bit decoders, output buffers and J/K flip-flops can be arranged not at the pitch of one circuit per programmable matrix row but at a doubled pitch of one circuit per two rows, the design in arrangement of these circuits can be achieved efficiently. Secondly, since almost all of the logic system input and output terminals could be connected to relatively adjacent logic system peripheral circuit blocks, there is no need to make connection through long wirings from the opposite side of the chip to the peripheral circuit as in the case where these peripheral circuits are disposed close to one edge of the matrix, and hence the arrangement is efficient in view of performance and a chip area.

Thirdly, taking the programming system into consideration, the programming current flows, in the illustrated embodiment, from one of the output terminals through the Y-decoder 18 and the OR matrix 20A or 20B or the AND matrix 10A or 10B in the sequence of (column)—(program element)—(row), and is absorbed by the X-decoder 17 which then serves as a current sink. When the X-decoder 17 is disposed at the center of the array as described above, the impedance of the array in the row direction can be reduced to one-half as composed to the case where the X-decoder is disposed at one end of the array.

For instance, in the prior art design the lengths of the wirings connecting the external terminals to the output buffers were as long as 8 mm at the maximum, whereas these lengths are reduced to 3 mm according to the present invention. The resulted reduction of the parasitic capacitance is about 2 pF, and with respect to a transmission delay time, improvement is achieved by about 10 μsec. As composed to the prior art arrangement, the chip area can be reduced by about 10%.

Figure 5:
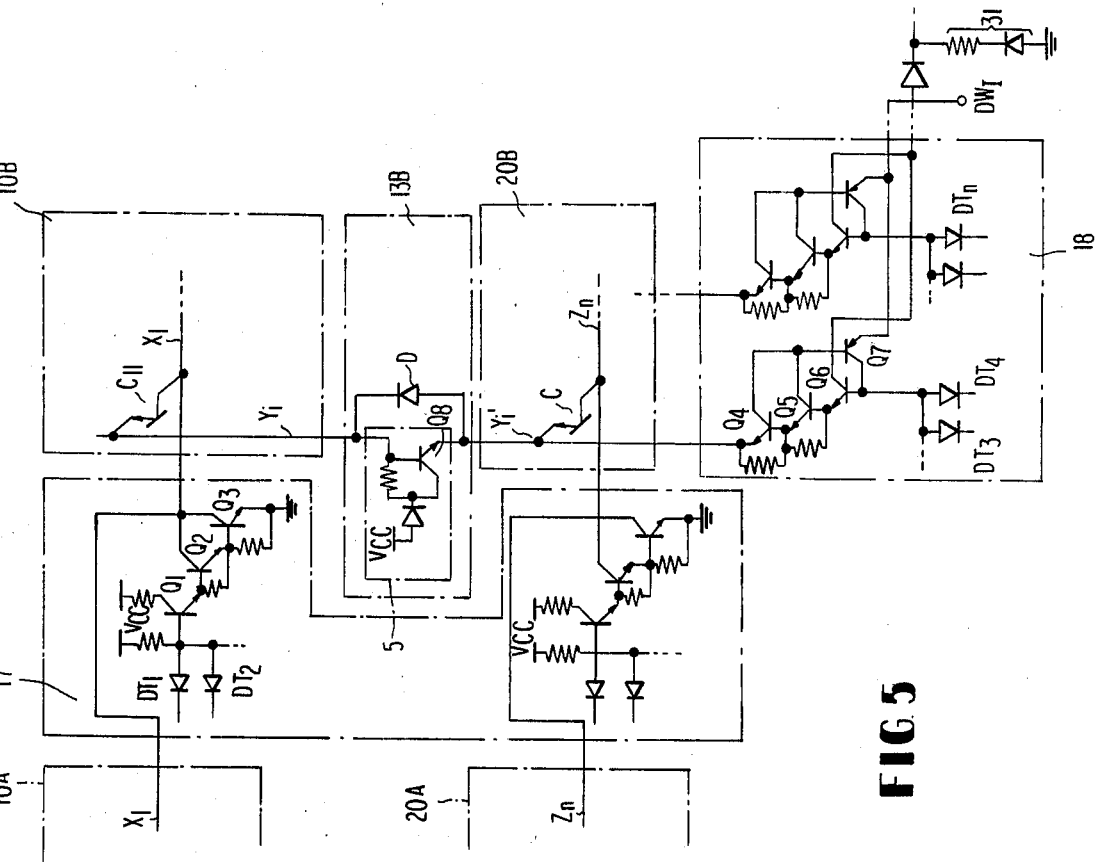
FIG. 5 is a circuit diagram showing a major part of a programming circuit.

In FIG. 5 is shown one example of a detailed circuit for the programming or writing route. For the program element C constituting the matrix, base-opened transistors are used. This cell can be written by forcibly passing a current between the emitter and the collector and thus short-circuiting the emitter-base junction. The reference numerals appearing in FIG. 5 coincide with those used in FIG. 4. In the X-decoder 17, diodes $DT_1$, $DT_2$ ... and a transistor $Q_1$ from a DTL circuit which produces a high level output at an emitter of the transistor $Q_3$ on selection. Transistors $Q_2$ and $Q_3$ form a Darlington type current sink circuit. The current sink circuit sinks an electric current from the input line $X_1$ in response to the high level at the emitter of the transistor $Q_3$. Other circuits for the other lines $X_2 \sim X_{71}$, and $Z_1 \sim Z_{48}$ are similarly structured.

The inverters 5 include an emitter-follower transistor $Q_8$. In the Y-decoder 18, diodes $DT_3$, $DT_4$ ... form a decode matrix and transistors $Q_4$ to $Q_7$ form a PNPN type switch circuit, in which the program terminal $OW_j$ is connected to an emitter of the transistor $Q_7$. A constant voltage circuit 31 is connected to a base of the transistor $Q_7$ and used for passing a trigger current to the PNPN switch circuit. When the program element $C_{11}$ is programmed, levels at cathodes of the diodes $DT_3$, $DT_4$ are made high and a program power supply is fed to the terminal $ON_j$ so that the switch circuit including the transistors $Q_4$ to $Q_7$ is made conductive to supply the program power supply to the line $Y'_j$. The program power supply supplied to the line $Y'_j$ is then transmitted to the line $Y_j$ through the diode D and to the emitter of the element $C_{11}$. On the other hand, levels at cathodes of the diodes $DT_1$, $DT_2$ ... are made high and the transistor $Q_3$ becomes conductive so that the program power supply at the emitter of the element $C_{11}$ is absorbed by the transistor $Q_3$ via a collector of the element $C_{11}$ and the line $X_1$. In this instance, a base emitter junction of the element $C_{11}$ is short-circuited to achieve programming.

Comparing the illustrated embodiment with the prior art example, the wiring resistance was decreased by about 3Ω and thus writing of the cell could be achieved stably. In addition, in the illustrated embodiment, the pellet size in the longitudinal direction is reduced by about 300 μm as compared to the prior art example.

According to the present invention, there is provided an IC including programmable elements which is very compact in design arrangement and has excellent performance, and so, the advantageous effect of the present invention is large.

While the present invention has been described above, by way of example, in connection with an FPLA, the present invention should not be limited to the illustrated embodiment, but it is equally applicable to integrated circuits which make use of, for example, fuse-link type program elements or non-volatile MOS type program elements.

We claim:

1. An integrated circuit comprising a first rectangular area, a second rectangular area adjacent to a first longitudinal side of said first rectangular area, a third rectangular area adjacent to a second opposite longitudinal side of said first rectangular area, a first group of row lines laterally extending in said second rectangular area, a second group of corresponding row lines laterally extending in said third rectangular area, a first group of column lines extending in the longitudinal direction in said second rectangular area, a second group of column lines extending in the longitudinal direction in said third rectangular area, a plurality of programmable elements disposed at intersections of the first group of row lines and the first group of column lines and at intersections of the second group of row lines and the second group of column lines, each of said programmable elements including a bipolar transistor coupled between one row line and one column line and being permanently changed from a first state, in which a base-emitter junction of the bipolar transistor is not broken down, to a second state, in which the base-emitter junction is broken down, by flowing a write current therethrough having a sufficient value for causing the breakdown of the base-emitter junction, a write selection circuit formed on said first rectangular area, said write selection circuit having a plurality of current output terminals each connected to an associated one of said first group of row lines and an associated one of said second group of row lines and operatively producing the write current at a selected one of said output terminals, and a column selection circuit for selecting one of said first and second group of column lines, whereby a current path for the write current between a selected row line and a selected column line via a selected programmable element is established, said column selection circuit being arranged along adjacent lateral sides of said second and third rectangular areas.

2. The integrated circuit according to claim 1, further comprising a fourth rectangular area adjacent to an outer longitudinal side of said second rectangular area, a fifth rectangular area adjacent to an outer longitudinal side of said third rectangular area, a first row input circuit arranged on said fourth rectangular area, a second row input circuit arranged on said fifth rectangular area, the row lines of said first group of row lines and their corresponding row lines of said second group of row lines being alternately electrically connected to output terminals of said first row input circuit and to output terminals of said second row input circuit, in which said first and second row input circuits provide row lines with data in a read operation mode.

3. The integrated circuit according to claim 2, in which said first and second row input circuits include decoders.

4. An integrated circuit comprising a power voltage terminal for receiving a power voltage, a reference voltage terminal for receiving a reference voltage, a program voltage terminal for receiving a program voltage, a first matrix of programmable elements arrayed in rows and columns formed on a first rectangular area, a second matrix of programmable elements arrayed in rows and columns formed on a second rectangular area, each of said programmable elements being changed from a first logic state to a second opposite logic state by flowing a write current more than a threshold value therethrough, said first and second rectangular areas being arrayed in parallel and separated from each other through a third rectangular area, the respective rows of said first matrix being electrically connected to corresponding rows of said second matrix, a plurality of first switch circuits formed on said third rectangular area, each of said first switch circuits being coupled between said reference voltage terminal and an associated one of said rows of said first matrix and the corresponding row of said second matrix, a plurality of second switch circuits located in column directions of said first and second matrices, each of said second switch circuits being coupled between said program voltage terminal and an associated one of said columns of said first and second matrices, a plurality of input circuits arrayed along a remote side of said first rectangular area from said second rectangular area and along a remote side of said second rectangular area from said first rectangular area, each of said input circuits selectively supplying rows of said matrices with a read current smaller than said threshold value, means for selectively enabling one of said first switch circuits, and means for selectively enabling one of said second switch circuits, whereby the write current is fed to a selected programmable element through the selected first switch circuit and the selected second switch circuit.

5. The integrated circuit according to claim 4, in which each of said programmable elements includes a bipolar transistor.

6. The integrated circuit according to claim 4, in which each of said second switch circuits includes a PNP type bipolar transistor and an NPN type bipolar transistor.

7. The integrated circuit according to claim 4, in which said programmable elements form AND arrays in said first and second matrices.

8. An integrated circuit comprising an AND array of programmable elements arranged in rows and columns, said AND array being physically divided into first and second column groups, an OR array of programmable elements arranged in rows and columns, said OR array being physically divided into first and second column groups, said first column group of said OR array being located in the same column direction as said first column group of said AND array, said second column group of said OR array being located in the same column direction as said second column group of said AND array, a plurality of first switch circuits arranged between said first column group and second column group of said AND array and between said first column group and second column group of said OR array, output terminals of said first switch circuits each being coupled to an associated one of said rows of said AND array and OR array, columns of said first and second column groups of said OR array each being electrically connected to the corresponding column of said first and second column groups of said AND array, a plurality of second switch circuits disposed along outer ends of the columns of said OR array, output terminals of said second switch circuits each being electrically connected to an associated one of said columns of said OR array, and a plurality of input circuits arranged along both ends of the rows of said AND array and said OR array, each of said input circuits being electrically coupled to an associated one of said rows to provide therewith an input signal, in which a write current is fed to a selected programmable element through the selected first switch circuit and the selected second switch circuit.

9. The integrated circuit according to claim 8, in which each of said programmable elements includes a bipolar transistor.

10. An integrated circuit comprising a first rectangular area, a second rectangular area adjacent to a first longitudinal side of said first rectangular area, a third rectangular area adjacent to a second opposite longitudinal side of said first rectangular area, a first group of row lines laterally extending in said second rectangular area, a second group of corresponding row lines laterally extending in said third rectangular area, a first group of column lines extending in the longitudinal direction in said second rectangular area, a second group of column lines extending in the longitudinal direction in said third rectangular area, a plurality of programmable elements disposed at intersections of the first group of row lines and the first group of column lines and at intersections of the second group of row lines and the second group of column lines, each of said programmable elements being changed from a first logic state to a second logic state by flowing a write current therethrough, a write selection circuit formed on said first rectangular area, said write selection circuit having a plurality of current output terminals each connected to an associated one of said first group of row lines and an associated one of said second group of row lines and operatively producing a write current at a selected one of said output terminals, and a column selection circuit for selecting one of said first and second group of column lines, whereby a current path between a selected row line and a selected column line via a selected programmable element is established, said column selection circuit being arranged along adjacent lateral sides of said second and third rectangular areas, said integrated circuit further comprising a fourth rectangular area adjacent to an outer longitudinal side of said second rectangular area, a fifth rectangular area adjacent to an outer longitudinal side of said third rectangular area, a first row input circuit arranged on said fourth rectangular area, a second row input circuit arranged on said fifth rectangular area, the row lines of said first group of row lines and their corresponding row lines of said second group of row lines being alternately electrically connected to output terminals of said first row input circuit and to output terminals of said second row input circuit, in which said first and second row input circuits provide row lines with data in a read operation mode.

11. An integrated circuit comprising field programmable read only memory cells arranged in an array of rows and columns, said memory array being divided into first and second column groups, each of said memory cells being changed from a first logic state to a second opposite logic state by flowing a write current therethrough having a larger value than a read current applied in a read mode, a first terminal, a second terminal, a plurality of first switch circuits positioned between said first column group and said second column group, each of said first switch circuits being coupled between said first terminal and an associated one of said rows, means for selectively enabling one of said first switch circuits, a plurality of second switch circuits arranged in the row direction along said memory array, each of said second switch circuits being coupled between said second terminal and an associated one of said columns and means for selectively enabling one of said second switch circuits, whereby said write current is fed to a selected memory cell through the selected first switch circuit and the selected second switch circuit based on a voltage imposed between said first terminal and said second terminal, said integrated circuit further comprising a plurality of input circuits for providing the rows with input signals, half of said input circuits being arranged along an outer side column of said first column group, another half number of said input circuits being arranged along an outer side column of said second column group.

* * * * *

UNITED STATES PATENT AND TRADEMARK OFFICE
CERTIFICATE OF CORRECTION

PATENT NO. : 4,398,266

DATED : August 9, 1983

INVENTOR(S) : Teiji Tamura et al

It is certified that error appears in the above-identified patent and that said Letters Patent is hereby corrected as shown below:

Column 4, line 53, "60 $82_m$." should be "60 µm.

Signed and Sealed this

Sixth Day of March 1984

[SEAL]

Attest:

Attesting Officer

GERALD J. MOSSINGHOFF

Commissioner of Patents and Trademarks